United States Patent [19]

Chernow

[11] 3,736,425

[45] May 29, 1973

[54] SCREEN FOR ION IMPLANTATION

[75] Inventor: Fred Chernow, Boulder, Colo.

[73] Assignee: Implama A.G. Z U G, Switzerland

[22] Filed: Mar. 27, 1972

[21] Appl. No.: 238,400

[52] U.S. Cl. ................250/49.5 T, 148/1.5, 250/105

[51] Int. Cl. ..........................H01j 37/00, G01n 23/00

[58] Field of Search ....................148/1.5; 250/49.5 R, 250/49.5 TE, 49.5 T, 105

[56] References Cited

UNITED STATES PATENTS 3,193,408 7/1965 Triller ..............................250/49.5 X 3,326,176 6/1967 Sibley ..............................250/49.5 X 3,491,236 1/1970 Newberry ............................250/49.5

3,619,608 11/1971 Westerberg .........................250/49.5

*Primary Examiner*—William F. Lindquist

*Attorney*—Richard C. Sughrue, Gideon Franklin Rothwell, Darryl Mexic et al.

[57] ABSTRACT

Ion implantation doping of a semiconductor wafer to form multiple integrated circuits is carried out by placing a variable opening mask between a large ion beam and the semiconductor wafer. The mask has a plurality of identical openings, one for each IC to be created, which may be varied in size by shifting the positions of elements which make up the mask. The elements are themselves masks having fixed openings. The relative movement of the elements causes a variation of the alignment of the several element masks to thereby vary the overall openings provided by the combination of the element masks.

6 Claims, 10 Drawing Figures

SCREEN FOR ION IMPLANTATION

BACKGROUND OF THE INVENTION

The invention is in the field of integrated circuit technology, and in particular is a masking arrangement to allow mass production of integrated circuits using ion implantation techniques for doping selected areas on multiple integrated circuit (IC) chips.

As is well known an IC is formed on a semiconductor chip, such as silicon, by coating the chip with an oxide, forming an opening in the oxide by photoetching techniques, and passing dopant atoms through the opening to render the exposed region of the chip either N type or P type, depending on the dopant used. For a single IC it is typical to carry out a number of dopant steps by closing the oxide covering, which acts as a mask, and reopening new holes over desired regions of the chip. Many of the doped regions overlap to provide the desired electrical configuration in the IC chip.

The most common doping technique is that known as diffusion. Once the mask opening is provided, the chip is exposed to an atmosphere consisting of dopant atoms which diffuse into the exposed region of the chip.

It is also typical to form a plurality of identical IC chips, e.g., 1,000, simutaneously on a single silicon or other semiconductor wafer. The wafer is divided into 1,000 equal IC areas, and the masking-photoetching technique creates corresponding openings over each IC for every diffusion step in the process. After the multiple IC's are formed, the IC's are separated by known dicing techniques.

A continuing problem in the mass production of the IC's is that of low yield. Because of errors or breakage, it is not uncommon that entire wafers of IC's will have to be thrown out as useless. A major contributor to the low yield of IC production is the masking step described above. Breakage occasionally occurs during the masking step. Mask misalignment is also a cause of defective IC's.

A different doping technique, which has been the subject of a great deal of investigation and which is disclosed in the prior art, is that of ion implantation. Instead of diffusing dopant atoms into the semiconductor chip, a beam of dopant ions is created and focused onto the target chip. The ions impinging upon the target create the desired N or P type region depending upon the type of ions in the ion beam. For example a beam of boron ions will create a P type region in silicon, and a beam of phosphorous ions will create an N type region in silicon. One advantage of ion implantation doping over diffusion doping is that the former allows greater control of the dimensions of the doped region. In diffusion doping, the doped region spreads or balloons outwardly underneath the mask opening. This spreading effect does not take place with ion implantation doping.

A great advantage of ion implantation could be realized if the oxide masking technique could be eliminated. It is possible to develop a finely focused ion beam that could be used to produce specific patterns of doped regions on the semi-conductor wafer. This could be performed in a manner quite similar to that used in an ordinary TV picture tube where the intensity and position of an electron beam is modulated in time to produce an image. For the case of doping by ion implantation, the electron beam is replaced by an ion beam and similar electrostatic plates are used to position the beam onto various areas of the wafer. By programming the position, the total number of particles/unit area implanted, and the species of particle, e.g. either boron or phosphoros, an IC circuit could, in principle, be readily developed without the use of oxide masks and photoetching or at least with a minimal use of these masks. It should be noted that the ion beam current density (ions/cm$^2$/sec) is most often a fixed quantity, and thus it is necessary to adjust the time of exposure to the ion beam in order to implant a specific number of ions/cm$^2$.

The fundamental limitation of writing an IC circuit with an ion beam is related to the time required to perform the task. The ion beam must be limited in current to prevent space charge blow up of the beam. This limitation results in a maximum beam current of 30$\mu$amps/cm$^2$ for typical beam energies and path lengths. The lower the energy, or the larger the path length, the greater the restriction on maximum current. Basically, the restriction is the result of interaction time for the beam. A parallel beam of ions will immediately begin to diverge due to the fact that all of the particles are similarly charged. Thus, as the beam advances toward the target electrostatic forces begin to increase the diameter of the beam. The total spread of the beam diameter depends on the time the beam travels. For a given path length, higher energy beams travel faster and have less time to interact and therefore are less plagued with space charge blow up. As the current density in the ion beam increases, the amount of electric charge increases and the forces resulting in the blow up increase. The value of 30$\mu$amps/cm$^2$ has been chosen as typical for ion implementation path lengths and beam energies being utilized today. A second and more stringent requirement is associated with the amount of power/unit area that must be dissipated by the silicon wafer being implanted. At 100 kV a 30$\mu$amp/cm$^2$ beam heats the wafer at a rate of 3 watts/cm$^2$ which is tolerable.

If a single beam having a current density of 100 $\mu$amps/cm$^2$ and an area of $10^{-6}$ cm$^2$ were used to implant $10^{13}$ ions/cm$^2$ in an area of 10 cm$^2$, it would take approximately 400 hours to perform the task. This unreasonably long time factor is the result of implanting only each spot sequentially and being limited to a maximum current density in the ion beam.

A prior art system has been devised which reduces the time factor by dividing a large ion beam into 100 smaller beams which simultaneously implant ions in 100 identical IC chips on a wafer. However this system is complex and can only implant circular shaped regions at any given instance. A mask having 100 2mm diameter holes is positioned between the large ion beam and the target wafer. A quarapole is positioned on the target side of the mask for each of the 2mm holes. In this manner each 2mm diameter beam is individually focused by its own electrostatic quadrapole to the desired beam size. By moving the mask-quardrapole device in a plane lateral to the ion beam direction, different areas of the target can be implanted with 100 simultaneous implants, and 100 IC's can be simultaneously built. It can be seen that the implantation of a region having a length much longer than its width requires a number of repeated exposures to the spot beam. The spot beam would be shifted following each exposure to trace out the desired pattern for the doped region.

SUMMARY OF THE INVENTION

In accordance with the present invention a large number of IC's, e.g. 1,000, can be simultaneously fabricated by using ion implantation doping without the need for individual quadrapoles for each individual beam and without the need for oxide masking. The improvement comprises a mechanical masking arrangement which provides a plurality of identical openings, onfor each IC to be implanted. The openings can easily be adjusted to the dimensions of any size square or rectangle within certain limits. The mask is placed close to and in front of a semiconductor wafer. A large ion beam floods the mask thereby creating multiple beams on the down stream side of the mask. Each of the smaller beams has a cross section substantially equal to the shape of the openings in the mask. By varying the opening areas, the cross section of the beam and the area implanted with ions is concomitantly varied. The openings can also be shifted latterally relative to the wafer thereby allowing one to select the exact position of the area to be implanted.

In one embodiment the mask comprises four parallel wire screens. Two screens control the width of the openings and the other two control the length or vertical dimension of the openings. Each of the first two screens comprises a set of parallel wires aligned vertically. The size and spacing of the wires is such to cause no open space at all when the two screens are misaligned. Openings having any desired width between zero and maximum, where maximum is the spacing between two adjacent wires in a single screen, can be obtained by shifting the screens horizontally relative to one another. The openings thus created can be shifted relative to the wafer by shifting the screens horizontally. The remaining two screens function in an identical manner except the parallel alignment and the screen movement takes place on an axis which is rotated 90° with respect to the first two screens.

In another embodiment the mask comprises two identical plates having multiple square openings. In this embodiment each plate is moved in the horizontal and vertical direction to align the plates to have the required opening size and shape.

The elements of the mask could be manually moved to provide the correct openings, but a preferable technique would be to program a computer or machine tool control system to move the elements to the desired alignment.

Figure 2:
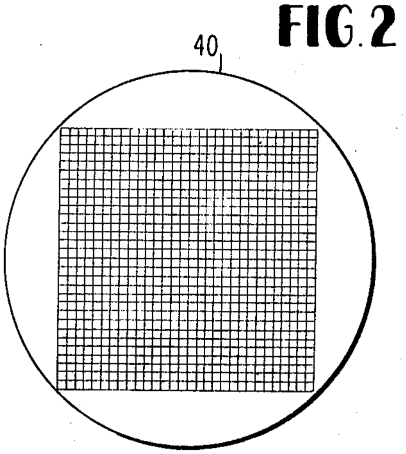
FIG. 2 is a top view of a silicon wafer having 900 equal areas thereon for formation of 900 identical IC circuits.

FIG. *2a* is a blow up of a portion of the wafer in FIG. 2 and illustrates, by way of example, an identical region for each IC which is to be implanted with dopant atoms.

Figure 3:
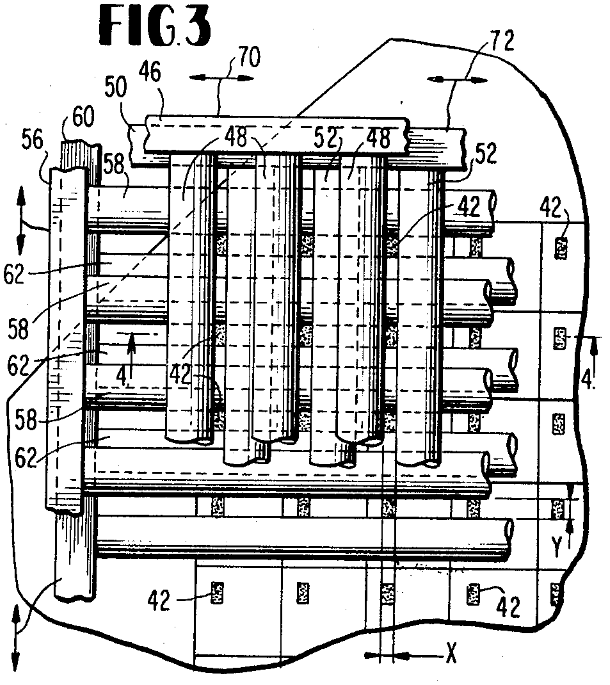

FIG. 3 illustrates a portion of a first preferred embodiment of the novel masking means overlaying and separated from the wafer.

Figure 4:
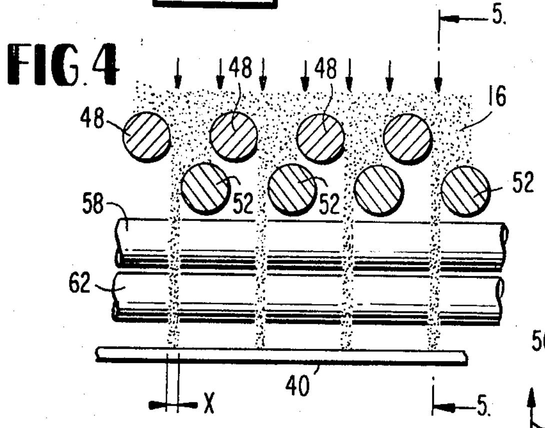

FIG. 4 is a side view of the apparatus shown in FIG. 3 taken along line 4—4.

Figure 5:
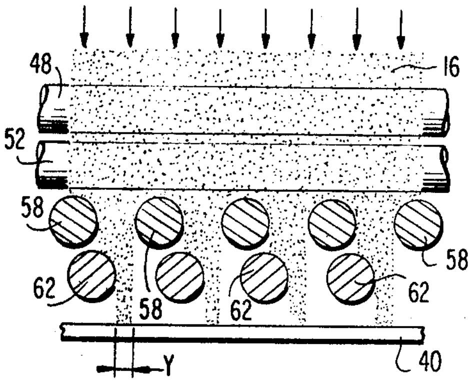

FIG. 5 is a side view of the apparatus shown in FIG. 4 taken along line 5—5.

Figures 6, 7:
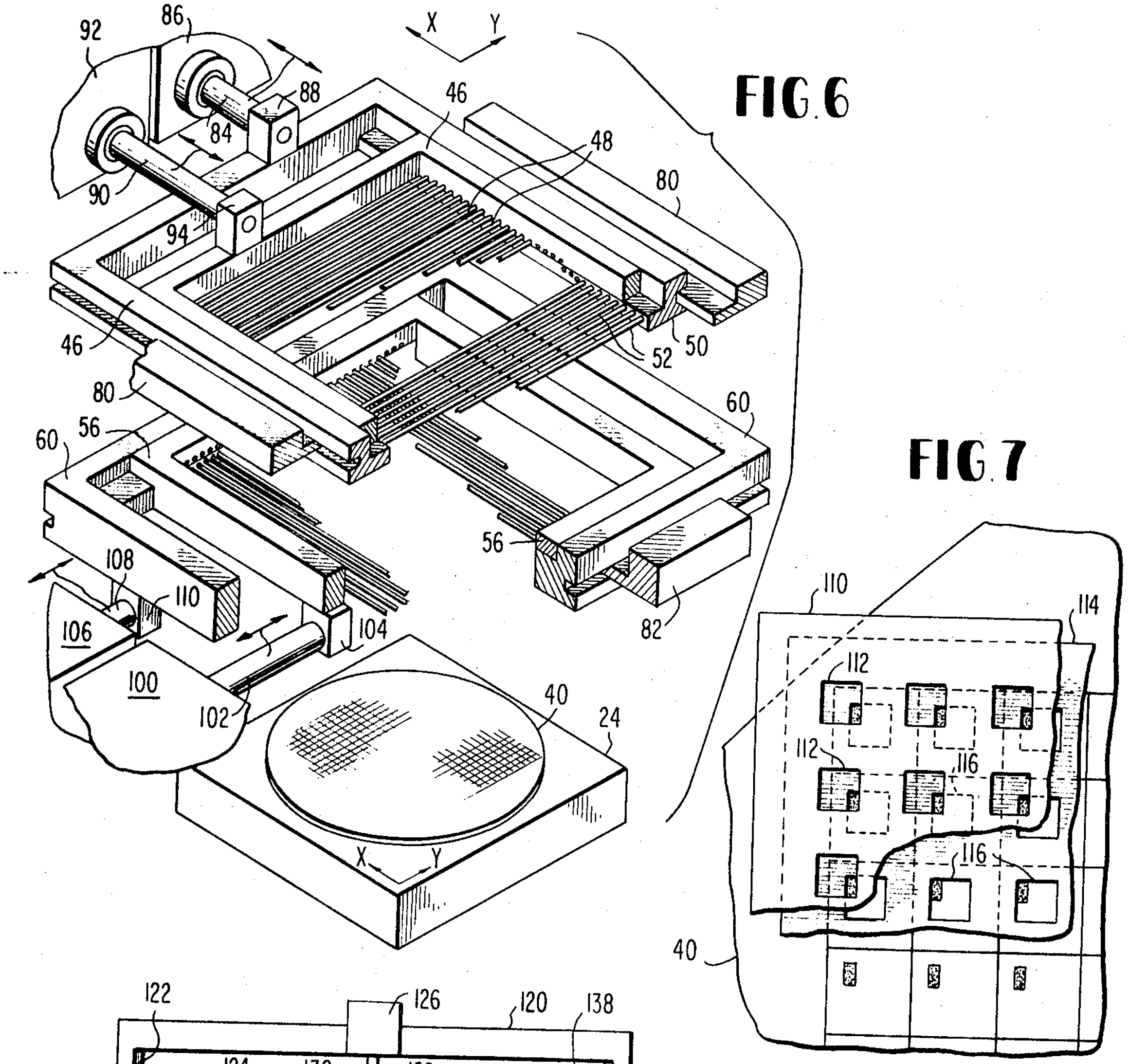

FIG. 6 illustrates an example of the mounting of the elements of the first preferred embodiment of the masking means.

FIG. 7 illustrates a portion of a second preferred embodiment of the masking means overlaying and spaced a small distance above a portion of a semiconductor wafer.

Figure 8:
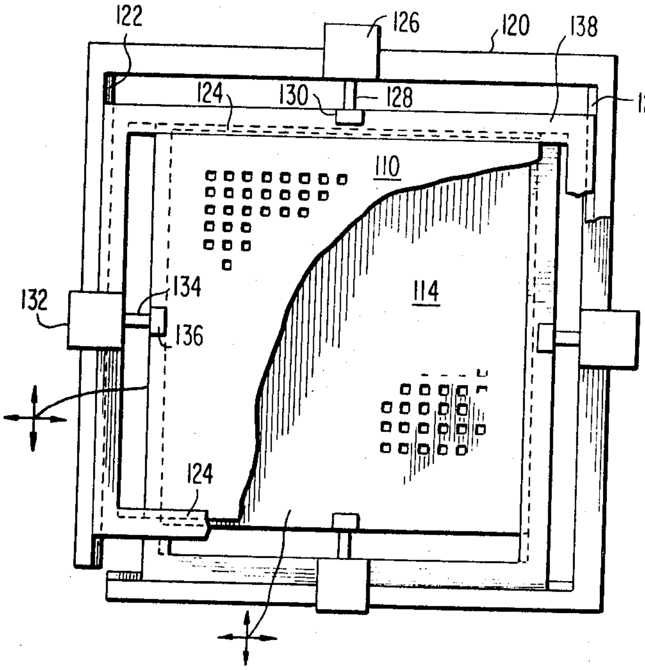

FIG. 8 illustrates an example of the mounting of the second preferred embodiment of the masking means.

Figure 9:
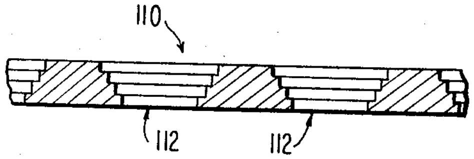

FIG. 9 is a cross sectional side view of one of the masks of FIGS. 7 and 8.

DETAILED DESCRIPTION OF THE INVENTION

Referring first to FIG. 2, there is shown a semiconductor wafer, e.g. silicon, on which 900 identical IC circuits are formed. The 900 small squares, in an array of 30 by 30, are shown on the wafer. As pointed out above, the typical prior art technique for doping selected regions in each IC area is to oxidize the entire surface of wafer 40, and, by photoetching techniques, to create identical openings over each IC area — each opening being equal in area to the region to be doped. Dopant atoms are then diffused through the openings to create the desired doped regions. The process is repeated for doping other regions of the same or different type conductivity. More than one region per IC area may be formed simultaneously by opening more than one region over each IC area. Furthermore, the process may be used where the IC's to be created are not identical.

The present invention uses a mechanical masking arrangement, which although not designed for doping more than one region per IC area simultaneously, has the advantage of allowing ion implantation doping and eliminating the oxide masking-photoetching step.

Figure 2A:
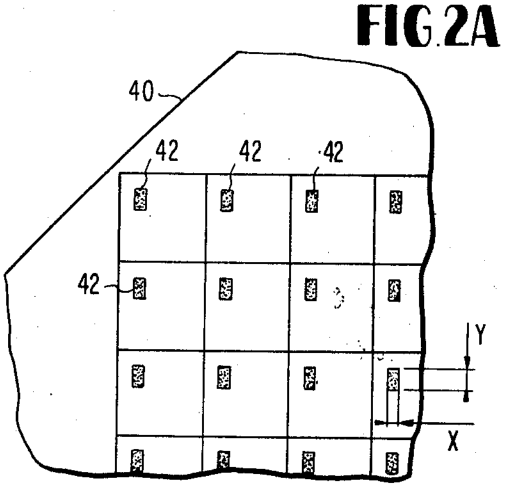

By way of example, the invention will be described in connection with the doping of a single region per IC area. The single regions 42, shown in FIG. 2A, are rectangular in shape, and are assumed to have X and Y dimensions of $20\mu$ and $50\mu$ respectively. It will also be assumed that each IC region is a square of dimension $500\mu$ on each side and therefore having an area of $0.25mm^2$.

Figure 1:
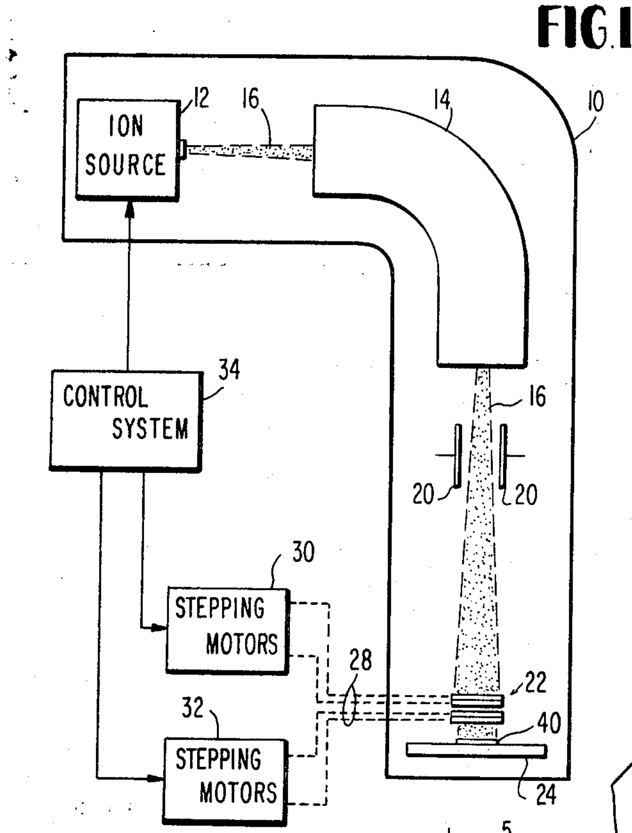
FIG. 1 is a diagram of an ion implantation system showing the general relationship between the ion source, the semiconductor wafer to be implanted with dopant ions, and the novel masking means.

As shown in FIG. 1, the wafer 40 is placed on a work surface 24 inside an ion implantation chamber 10. At the opposite end of chamber 10 is an ion source 12 which generates a stream of ions 16. The ion beam 16 passes through an anlyzer 14 afocusing and accelerating electrodes, shown generally at 20, and floods the top surface of masking means 22. The masking means is placed at a close distance, e.g. 10cm, above wafer 40. In the example described there are 900 openings in masking means 22. The openings are rectangular and have X and Y dimensions corresponding to or slightly smaller than the dimension of regions 42. The result of masking is that 900 small ion beams having the required cross sections impinge on the IC areas in the desired regions. All elements described thus far in connection with FIG. 1, except for masking means 22, are conventional and will not be described in detail. The masking means 22 is comprised of elements which can be shifted laterally relative to the wafer 40 and relative to each other to open different sized holes and to reposition the holes over different areas of each IC area.

The lateral movement of the elements could be controlled by conventional gearing means which in turn could be operated manually. After each region is doped, the mask elements would be moved laterally to create the new openings for a subsequent doping step. As an alternative the gears could be controlled by a properly programmed computer as is conventional in automatic machine tool systems. Such an automatic system is shown generally in FIG. 1 as comprising a programmed control system 34, stepping motors 30 and 32, and gearing means 28. The control system could easily be programmed to actuate the stepping motors to rotate the gears predetermined amounts to create desired mask openings. The control system could also be programmed to turn on and off the ion source 12 or to switch between two different ion sources to provide P type and N type doping. After a prefixed time of implantation, the source would be turned off and the stepping motors actuated to create new mask openings, and the source turned on again.

Whether the mask movement is manual or automatic tolerances of $0.1\mu$ accuracy will be necessary. A known gearing arrangement for providing such extreme tolerances comprises two intermeshed worm gears which are turned in opposite directions.

In one embodiment the mask comprises four wire screens as shown partially in FIGS. 3, 4 and 5. The first two screens define the X dimension, or horizontal dimension, of the opening, whereas the second two screens define the Y dimension, or vertical dimension of the opening. The first or top screen comprises frame member 46 and parallel wires 48 attached thereto. The second screen compirses frame member 50 and parallel wires 52 attached thereto. Wires 48 and 52 are aligned parallel in the vertical direction and frame members 46 and 50 are moveable in the horizontal direction as indicated by arrows 70 and 72. All wires are identical in size and have diameters equal to $\frac{1}{2}$ N + Δ, where N is the dimension of a side of an IC area and Δ is any slight amount, e.g. 1–5$\mu$.

The spacing between wires in each of the screens is $\frac{1}{2}$ N − Δ. Thus each of wires 52 and 48 has a diameter slightly greater than one half an edge of an IC area, and if the two screens are completely misaligned there will be no opening therebetween. By visualizing relative movement of screens 46 and 50 it can be seen that identical openings having an X dimension anywhere between 0 and $\frac{1}{2}$ N − Δ (250$\mu$–Δ in the example chosen) can be created. It will also be appreciated that movement of both frames 46 and 50 in fixed relation to each other and relative to wafer 40 causes a repositioning of the openings. Assuming there are thirty one wires in each of the first two screens, thirty identical openings will be created, and each opening will be horizontally displaced from adjacent openings by a distance exactly equal to the edge dimension of an IC area. While the latter two screens control the size and position of the X dimension of the opening, each opening extends in the Y dimension the length of the frame, which is at least as great as 30N (a column of IC areas).

The Y dimension of the mask openings is controlled by the third and fourth screens in an identical manner to that described above. The third screen comprises frame 56 and wires 58 connected thereto. The fourth screen comprises frame 60 and wires 62 connected thereto. In the example described the screens, placement of wires, and diameters of wires are identical to the first and second screens, except that the wires 58 and 62 are parallel in the horizontal direction and the frames 56 and 60 are moveable in the vertical direction. It will be appreciated that for the case where the IC areas are not square, but are rectangular, the diameter of the wires and spacing between wires will not be the same for the first and second sets of screens. For example, if each IC area is a rectangle having an X dimension N and a Y dimension M, the diameter and spacing described above will apply only to the first and second screens. For the third and fourth screens, the diameter of the wires will be $\frac{1}{2}$ M + Δ and the space between adjacent wires will be $\frac{1}{2}$ M − Δ.

It should thus become apparent that by selectively moving the four wire screens in the permissible directions (along the X axis for screens one and two; along the Y axis for screens three and four) 900 rectangular or square openings of any area up to approximately one fourth the area of an IC can be created and positioned over corresponding regions of the 900 IC areas on wafer 40.

The beam 16 impinges upon the mask. Those ions passing through the openings create new ion beams having cross sectional dimensions commensurate with the size of the openings. Those ions impinging directly on the wires will be captured by the wires which are electrically conductive and preferably grounded.

Looking at the cross section of a wire that is being used to shape the beam (see FIG. 4 or 5), we note that the slope of the beam is determined by the smallest lateral separation distance between adjacent wires 48 and 52 (in FIG. 4) or 58 and 62 (in FIG. 5). In time as the ion beam continues to impinge on the surfaces of the wires some of the wire material is sputtered away. The distance X (in FIG. 4) or Y (in FIG. 5) will, as a result of the sputtering of the wire begin to increase in size although this was not intended. However, although the change in dimension of the wire thickness occurs rapidly at first (since it requires only small amounts of material to be removed) the process rapidly slows down because the amount of material to be removed increases.

One example of a mechanical arrangement for providing the necessary relative and/or simultaneous movement of the screens is shown in FIG. 6. The masking means is positioned above the work table 24 having the wafer 40 thereon. Fixed frame member 80, only partially shown, supports and guides slidable frame members 50 and 46. Slidable frame member 50 slides in the X direction along a track on fixed member 80 to properly position parallel wires 52. The movement of frame member 50 is controlled by a shaft 84 which is moveable in the X or horizontal direction and which is attached at one end to frame member 50 by means of connecting flange 88. At the other end of shaft 84 is a gear box 86 which contains a gearing arrangement, e.g. intermeshed worm gears. Slidable frame member 46 slides on a track provided therefor on member 50. A similar control arrangement comprising gear box 92, shaft 90, and connecting flange 94 controls movement of frame member 46.

A substantially identical arrangement is provided for the third and fourth screens to move them along the Y or vertical axis. Slidable frame member 56 slide along a track on frame member 60 under control of gear means 100, shaft 102, and connecting flange 104. Frame member 60 is also slidable on a track provided therefore on fixed frame 82. The frame member 60 is controlled by gear means 106, shaft 108, and connecting flange 110.

An alternative embodiment of the masking means comprises only two screens or plates, each of which is moveable along both X and Y axes. As shown in FIG. 7, the masking means comprises first plate 110 having square aperatures 112 therein. In the specific example described each square aperature has a dimension of $\frac{1}{2}$ N $-$ Δ on a side, where N is the edge dimension of an IC area. Adjacent aperature edges are separated by a distance of $\frac{1}{2}$ N + Δ. Thus the area of each square aperature is slightly less than one fourth of the area of an IC area. A second plate 114, having square aperatures 116 therein, is identical to the first plate. By moving both plates relative to each other along both the X and Y axes, a plurality of square or rectangular openings, one for each IC, of desired dimensions and position are created. The largest edge size of any opening is approximately one half the edge size of an IC. As in the case of the wire screens, the plates are electrically conductive and preferably grounded.

An example of a mechanical arrangement for controlling movement of plates 110 and 114 is illustrated in FIG. 8. Since the mechanism for controlling movement of plate 114 is identical to that for controlling plate 110, only the latter will be described. A fixed frame 120 having tracks 122 thereon is provided for support of a moveable frame 138. The plate 110 slides along tracks 124 in frame 138. A first gear means 126, which is fixed relative to fixed frame member 120, controls movement of frame member 138 and plate 110 along the vertical axis. The gear means 126 moves a shaft 128, along the vertical axis, and the shaft 128 is connected to moveable frame member 138 by means of connecting flange 130. A gear means 132 is mounted on frame 138 and controls movement of plate 110 along the horizontal axis by means of shaft 134 and connecting flange 136.

In forming the aperatures in the plates, it may be preferable to successively etch squares of decreasing size in a flat plate, resulting in a configuration illustrated in the cross sectional view shown in FIG. 9.

The above described embodiments of masking means for ion implantation doping enables a large number of square or rectangular regions on a wafer to be simultaneously doped. The mask aperatures are variable in size and position, and successive doping steps may be carried out by adjusting the positions of the elements forming the mask. The masking arrangement is particularly compatable with well known automatic machine tool techniques to allow the entire doping process to be automatically controlled, as described generally above.

An additional advantage of the invention is that any planned doping scheme can be completely checked out prior to actual doping by using optical techniques. For example, a light source and lens system could be provided in place of the ion source and ion beam focusing equipment, and a photographic plate could be substituted for the target wafer. Different color light could be used to simulate P and N doping. The mask could then be adjusted for repeated exposures in the same way it is intended to be adjusted for repeated implantation steps. The developed film would show the pattern of doping to be obtained if the mask were moved during implantation in accordance with the same program, whether manual or automatic.

What is claimed is:

1. An ion implantation system for doping identical regions on a plurality of areas of a semiconductor wafer, said system comprising, a. means for directing an ion beam towards said wafer, and b. masking means interposed in front of said wafer to intercept said ion beam and pass portions of said beam through multiple variable size openings in said masking means, said masking means comprising, i. a first screen having a plurality of elongated parallel openings extending in a first direction, ii. a second screen substantially identical to said first screen, said first and second screens being mounted to be individually moveable in a plane parallel to the plane of said wafer in a second direction perpendicular to said first direction.

2. An ion implantation system as claimed in claim 1 wherein said masking means further comprises, a. a third screen having a plurality of elongated parallel openings extending in said second direction, and b. a fourth screen substantially identical to said third screen, said third and fourth screens being mounted to be individually moveable in a plane parallel to the plane of said wafer in said first direction, all four of said screens being positioned in stacked relation to one another to provide a plurality of rectangular mask openings.

3. An ion implantation system as claimed in claim 2 wherein each of said first and second screens comprises, a plurality of cylindrically shaped wires fixedly positioned parallel to each other, all said wires having the same diameter, said diameter being slightly greater than the spacing between adjacent parallel wires, the space between said wires being said elongated openings extending in said first direction.

4. An ion implantation system as claimed in claim 3 wherein each of said third and fourth screens comprises, a plurality of cylindircally shaped wires fixedly positioned parallel to each other, each said wire having an identical diameter, said diameter being slightly greater than the spacing between adjacent parallel wires, the space between said wires being said elongated openings extending in said second direction.

5. An ion implantation system for doping identical regions on a plurality of areas of a semiconductor wafer comprising, a. means for directing an ion beam towards said wafer, b. masking means interposed in front of said wafer to intercept said ion beam and pass portions of said beam through multiple variable size openings in said masking means, said masking means comprising, i. a first plate positioned above and parallel to the plane of said wafer, said plate having a plurality of square openings therein, positioned in rows and columns, ii. means for moving said first plate in any direction in a plane parallel to the plane of said wafer.

iii. a second plate substantially identical to said first plate and positioned above and close to said first plate in a plane parallel to the plane of said wafer, and iv. means for moving said second plate in any direction in a plane parallel to the plane of said wafer.

6. An ion implantation system as claimed in claim 5 wherein the edge dimension of said square openings is slightly less than the spacing between adjacent square openings.

* * * * *